United States Patent [19]

Gonya et al.

[11] Patent Number: 5,411,703
[45] Date of Patent: May 2, 1995

[54] LEAD-FREE, TIN, ANTIMONY, BISMTUH, COPPER SOLDER ALLOY

[75] Inventors: Stephen G. Gonya; James K. Lake, both of Endicott, N.Y.; Randy C. Long, Friendsville, Pa.; Roger N. Wild, Owego, N.Y.

[73] Assignee: International Business Machines Corporation, Armonk, N.Y.

[21] Appl. No.: 79,065

[22] Filed: Jun. 16, 1993

[51] Int. Cl.⁶ .............................................. C22C 13/02
[52] U.S. Cl. .................................. 420/561; 148/400; 148/405
[58] Field of Search ...................... 420/559, 561, 562; 148/400, 405; C22C 13/00, 13/02

[56] References Cited

U.S. PATENT DOCUMENTS

| | | | |
|---|---|---|---|
| 3,607,253 | 9/1971 | Cain | 420/562 |
| 4,643,875 | 2/1987 | Mizuhara | 420/502 |
| 4,667,871 | 5/1987 | Mizuhara | 228/122 |
| 4,778,733 | 10/1988 | Lubrano et al. | 428/647 |
| 4,797,328 | 1/1989 | Boehm et al. | 428/621 |
| 4,806,309 | 2/1989 | Tulman | 420/562 |
| 4,929,423 | 5/1990 | Tucker et al. | 420/561 |
| 5,314,758 | 5/1994 | Carey, II et al. | 420/559 X |

OTHER PUBLICATIONS

McCormack et al., "Progress in the Development of New Lead-Free Solder Alloys," *JOM* Jul. 1993, vol. 45, No. 7 pp. 36–40.

Journal Environmental Science, A26(6), 911–929 (1991) (no month available) K. S. Subramanian et al "Leaching Of Antimony, Cadmium, Copper Lead, Silver, Tin and Zinc From Copper Piping With Non–Lead–Based Soldered Joints".

*Primary Examiner*—Scott Kastler
*Assistant Examiner*—Sean Vincent
*Attorney, Agent, or Firm*—Richard M. Goldman

[57] ABSTRACT

A high solidus temperature, high service temperature, high strength multi-component solder alloy having a major portion of Sn and effective amounts of Sb, Bi and Cu.

1 Claim, No Drawings

LEAD-FREE, TIN, ANTIMONY, BISMTUH, COPPER SOLDER ALLOY

FIELD OF THE INVENTION

The present invention relates to lead free, low toxicity solder alleys that are particularly useful in microelectronic applications. The solder alloys of the invention contain at least about 90 weight percent Sn and effective amounts of Sb, Bi and Cu. One such solder composition contains about 93.0 to 94.0 weight percent Sn, about 2.5 to 3.5 weight % Sb, about 1.5 to 2.5 weight % Bi, and about 1.0 weight % Cu. The solder alloys of the invention are particularly useful in joining integrated circuit chips to chip carriers and substrates, as printed circuit boards, joining chip carriers to substrates, and joining circuitization lands and pads in multilayer printed circuit boards.

BACKGROUND OF THE INVENTION

Soldering is a low temperature, generally reversible, metallurgical joining process. Low temperature and reversibility are especially important in electronics applications because of the materials involved and the necessity for reworking and making engineering changes.

Solder joining is a wetting process followed by a chemical reaction. Molten solder wets selectively. The selective wettability of solders allow molten solder to be confined to desired sites. This is especially important in flip chip bonding, and in working with solder masks.

The soldering process can be accomplished as quickly as the wetting takes place, for example, on the order of a few seconds. This makes soldering particularly desirable for automated, high speed, high throughput processes.

Wettability is also a function of the materials to be joined, with Cu, Ni, Au, and Pd, as well as alloys rich in one or more of these metals, being particularly amenable to soldering.

The chemical reaction following wetting is between the molten solder and the joining metallurgy to form an intermetallic phase region at the interface. The intermetallic phases formed by solders in electronic packaging are stoichiometric compounds, typically binary compounds, and typically containing Sn if Sn is present in the solder alloy. When the base, pad, or land is Cu, and the solder alloy is rich is Sn, the intermetallic formed during soldering is Cu-Sn. Exemplary Cu-Sn binaries include $Cu_3Sn$ and $Cu_6Sn_5$.

Solder alloys are characterized by the melting temperature being a strong function of composition. While a pure metal is characterized by a single, invariant, melting temperature, the freezing and melting points of alloys are complex. The freezing point of an alloy is determined by the liquidus line. Above the liquidus line only a liquid phase or phases can exist. The melting point of an alloy is determined by the solidus line. Below the solidus line only a solid phase or phases can exist. In the region between these two lines, i.e., between the liquidus line and the solidus line, solid and liquid phases can co-exist.

The preferred soldering alloys are eutectics, that is, they are characterized by a eutectic point. The eutectic point is where the liquidus and solids lines meet. A concentration change in either direction from the eutectic results in an increase in the liquidus temperature.

The composition, and the quench rate, also determine the microstructure and the resulting mechanical properties of the solder joint. Thus, it is necessary to both carefully choose the solder composition and to carefully control the thermal exposure of the soldered joint.

A solder composition used in electronics fabrication must be wettable as a solder alloy, and have at least one component capable of forming an electrically conductive, thermally stable, non-brittle, plastic intermetallic with the pad or land metallurgy. For this reason, the most common solder alloys are lead based alloys, as Sn-Pb alloys.

Heretofore, Pb/Sn solders have been utilized for electronic applications. There have been many historical reasons for the wide spread use of Pb/Sn alloys. These historical reasons include the low solidus temperature of Pb/Sn solder alloys, the workability of Pb/Sn alloys and of the resulting Cu/Sn intermetallics (formed at the solder/Cu contact interface) over a wide temperature range, the adhesion of Cu/Sn intermetallics obtained from Pb/Sn alloys to Cu lands and pads, and the ready availability of process equipment and low cost adjuncts, as resins, fluxes, and solder masks, for Pb/Sn alloys.

The relatively low temperatures required for processing Pb/Sn solder alloys are particularly important when polymeric dielectrics are used in the fabrication of electronic packages. These polymers can degrade in high temperature assembly operations. Solder alloys which melt at relatively low temperatures can accommodate these polymeric substrates.

Additionally, semiconductor chips are subject to thermal diffusion and structural transformations at elevated temperatures. Low melting solders avoid these problems.

Especially important is the "softness" or plasticity of lead based solders. This softness or plasticity allows the solder to accommodate the mismatch in coefficients of thermal expansion between the bonded structures, for example the mismatch in coefficient of thermal of thermal expansion between a ceramic dielectric and a polymeric dielectric, or between a semiconductor chip and a ceramic or polymeric chip carrier or substrate.

However, lead is a toxic, heavy metal with a relatively high vapor pressure. Its use is disfavored, and a need exists for a replacement.

U.S. Pat. No. 4,806,309 to Stanley Tulman for TIN BASE LEAD-FREE SOLDER COMPOSITION CONTAINING BISMUTH, SILVER, AND ANTIMONY describes solder compositions containing from 90 to 95% Sn, from 3 to 5% Sb, from 1 to 4.5% Bi, and from 0.1 to 0.5% Ag. Tulman describes the use of Bi to lower the melting point of the solder to about 425 degrees F (218 degrees C).

OBJECTS OF THE INVENTION

It is a primary object of this invention to provide a lead free solder.

It is a further object of this invention to provide a lead free solder that wets and forms a chemically and thermally stable bond with the bonding metallurgy typically used in electronics fabrication, e.g., Cu, Au, Ag, and Pd, especially while avoiding wetting organic materials as substrates and solder masks.

It is a further object of this invention to provide a lead free solder having that flows at low enough temperatures to avoid damage to electronic materials.

SUMMARY OF THE INVENTION

The shortcomings of the prior art are obviated and the objects of the invention are achieved by the Sn based, high solidus temperature, high service temperature, high strength multi-component solder alloy. The alloy contains at least about 90 weight percent Sn effective amounts of Sb, Bi and Cu.

DETAILED DESCRIPTION OF THE INVENTION

According to the invention a tin based, high solidus temperature, high service temperature, high strength multi-component solder alloy. The alloy contains at least about 90 weight percent Sn and effective amounts of Sb, Bi and Cu.

One preferred alloy of the invention contains about 93.0 to 94.0 weight percent Sn, about 2.5 to 3.5 weight % Sb, about 1.5 to 2.5 weight % Bi, and about 1.0 to 2.0 weight % Cu, as shown in the Table below:

| Component | Concentration (weight %) |
|---|---|
| Sn | 93.0–94.0 weight % |
| Sb | 2.5–3.5 weight % |
| Bi | 1.5–2.5 weight % |
| Cu | 1.0–2.0 weight % |

According to one preferred embodiment of the invention there is provided a method of electrically connecting an integrated circuit chip to a circuitized substrate. This interconnection method includes the step of depositing a solder alloy comprising at least about 90 weight percent Sn and effective amounts of Sb, Bi and Cu, and preferably about 93.0 to 94.0 weight percent Sn, about 2.5 to 3.5 weight % Sb, about 1.5 to 2.5 weight % Bi, and about 1.0 to 2.0 weight % Cu onto electrical contacts of the integrated circuit chip. The solder alloy may be applied by wave solder deposition, electrodeposition, or as a solder paste.

The electrical leads of the circuitized substrate are then brought into contact with the solder alloy on the electrical contacts of the integrated circuit chip. Where the chip is to be mounted in a "flip chip" conformation, the current leads of the circuitized substrate are pads on the substrate, and the solder alloy deposits are brought into contact with the pads. Alternatively, where the integrated circuit chip is mounted right side up, the current leads are wire leads, and tab inner lead connections, and they are brought into contact with the solder alloy contacts on the top surface of the integrated circuit chip.

While the substrate current leads and the solder deposits are maintained in contact the solder alloy is heated to cause the solder alloy to wet and bond to the electrical leads of the circuitized substrate. Heating may be by vapor phase reflow, infrared reflow, laser reflow, or the like.

The resulting microelectronic circuit package of the invention is an integrated circuit chip module with a circuitized chip carrier, i.e., a substrate, a semiconductor integrated circuit chip, and a solder alloy bond electrical interconnection between the circuitized chip carrier and the semiconductor integrated circuit chip. The alloy is a solder alloy comprising at least about 90 weight percent Sn and effective amounts of Sb, Bi and Cu, and preferably about 93.0 to 94.0 weight percent Sn, about 2.5 to 3.5 weight % Sb, about 1.5 to 2.5 weight % Bi, and about 1.0 to 2.0 weight % Cu.

The invention may be understood by reference to the following example. A sample solder aloy having the following composition was prepared:

| Alloy | Sn | Sb | Bi | Cu |
|---|---|---|---|---|
| 1 | 93.5 | 3.0 | 2.0 | 1.5 |

While the invention has been described with respect to certain preferred embodiments and exemplifications, it is not intended to limit the scope of the invention thereby, but solely by the claims appended hereto.

We claim:

1. A high solidus temperature, high service temperature, high strength multi-component, lead-free solder alloy consisting of 93.0 to 94.0 weight percent Sn, 2.5 to 3.5 weight % Sb, 1.5 to 2.5 weight % Bi, and 1.0 to 2.0 weight % Cu.

* * * * *